United States Patent [19]

Devolder et al.

[11] Patent Number: 4,529,984
[45] Date of Patent: Jul. 16, 1985

[54] PULSE SIGNAL QUANTIFICATION DEVICE FOR SECONDARY RADAR

[75] Inventors: Claude Devolder; Gérard Gaultier, both of Paris, France

[73] Assignee: Thomson-CSF, Paris, France

[21] Appl. No.: 328,269

[22] Filed: Dec. 7, 1981

[30] Foreign Application Priority Data

Dec. 9, 1980 [FR] France ............... 80 26072

[51] Int. Cl.³ ............................................. G01S 13/76
[52] U.S. Cl. ................... 343/5 VQ; 343/7 A
[58] Field of Search ............ 343/5 VQ, 5 DP, 6.5 R, 343/7 A, 17.1 R, 5 CF, 7.7

[56] References Cited

U.S. PATENT DOCUMENTS

| | | | |
|---|---|---|---|
| 3,162,852 | 12/1964 | Altovsky et al. ............... | 343/5 VQ |
| 3,701,149 | 10/1972 | Patton et al. .................. | 343/7 A |
| 3,855,593 | 12/1974 | Van Hijfte et al. ............ | 343/5 VQ |
| 3,946,382 | 3/1976 | Kossiakoff et al. ............ | 343/5 VQ |
| 4,150,375 | 4/1979 | Ross et al. ..................... | 343/5 CF |
| 4,159,477 | 6/1979 | Le Beyec ........................ | 343/5 CF |
| 4,224,620 | 9/1980 | Seiersen ......................... | 343/5 VQ |
| 4,242,683 | 12/1980 | Cappon et al. ................. | 343/7.7 |

FOREIGN PATENT DOCUMENTS 2214896 9/1981 France .

OTHER PUBLICATIONS

The Review of Scientific Instruments, vol. 43, No. 11, 11/1972, New York; F. E. Hoge et al.: "A Slope Reversal Video Processor Having Amplitude and Pulse Width Discrimination", pp. 1612–1618.

Primary Examiner—T. H. Tubbesing
Assistant Examiner—John B. Sotomayor
Attorney, Agent, or Firm—Oblon, Fisher, Spivak, McClelland & Maier

[57] ABSTRACT

An electronic device is provided for quantifying video frequency pulse signals, comprising a first and a second signal-formation channel having a common input connected to a source of input signals and outputs connected to a level comparator with two output states; the ratio of the gains and the DC level difference of said first and second channels having predetermined values; the first channel comprising a delay circuit provided with substantially equidistant taps which are connected respectively to the inputs of an "OR" type linear operator, the output of this operator being connected to a first input of a summing circuit whose second input is connected to a DC voltage source, the second channel comprising essentially a delay circuit.

7 Claims, 6 Drawing Figures

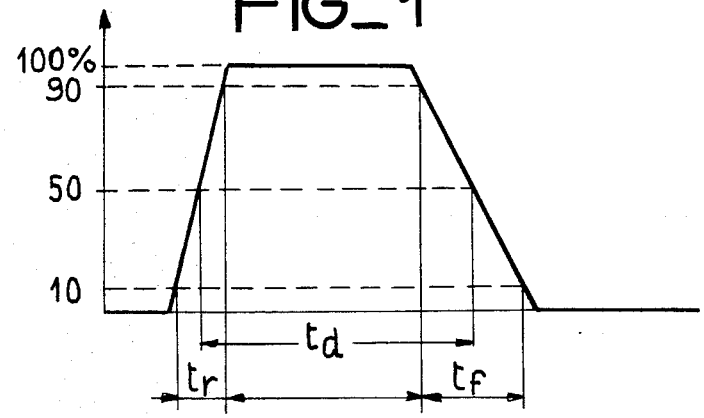
FIG_1
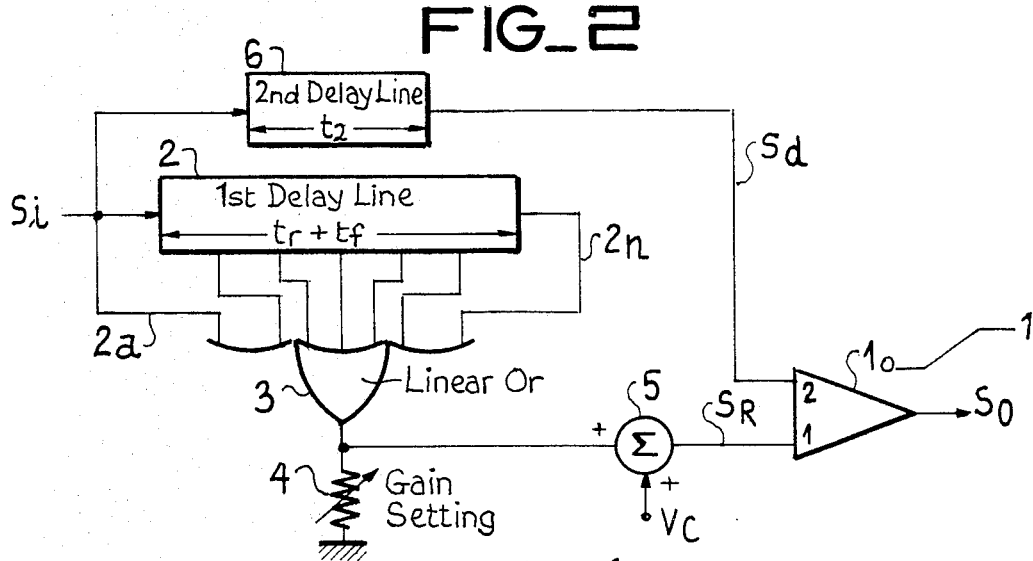
FIG_2
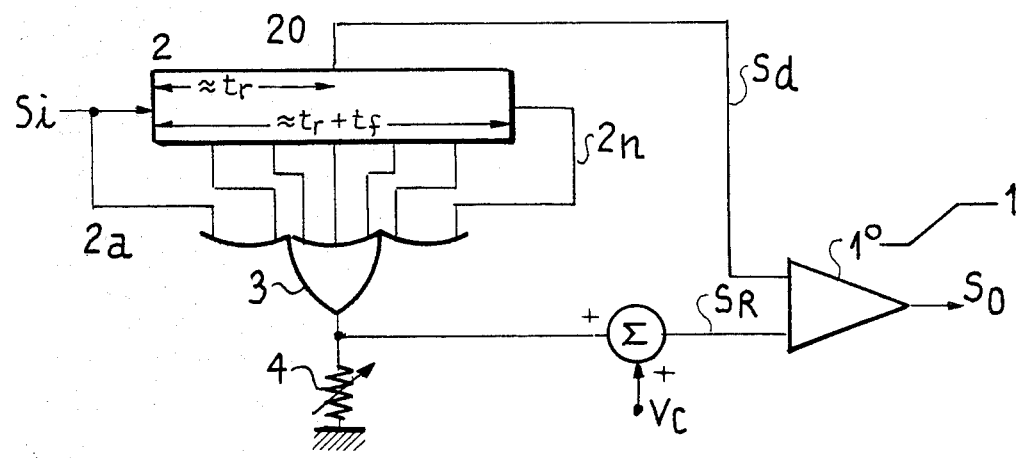
FIG_4

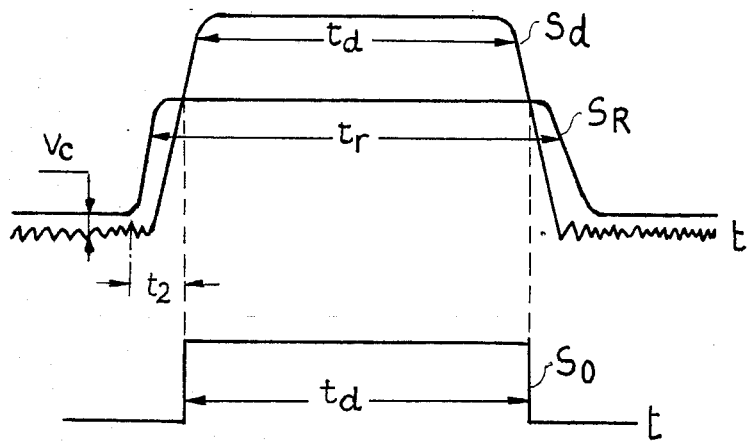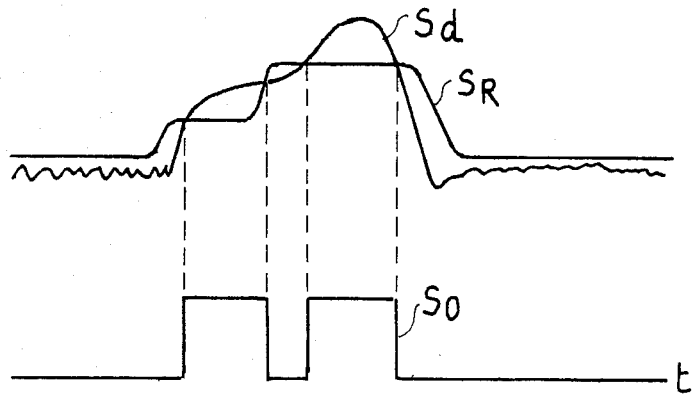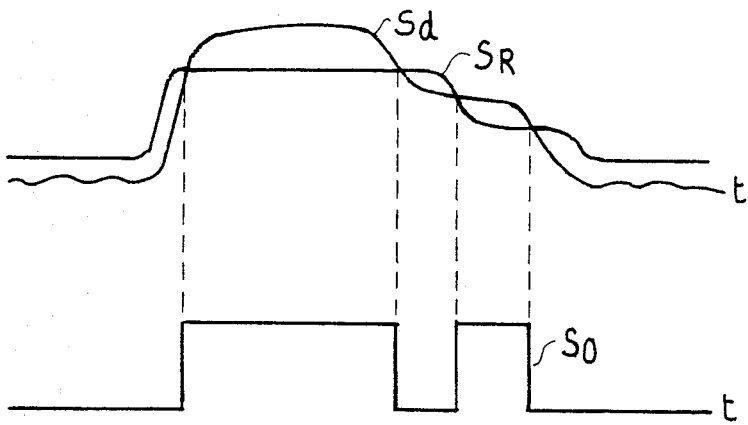

PULSE SIGNAL QUANTIFICATION DEVICE FOR SECONDARY RADAR

BACKGROUND OF THE INVENTION

1. Field of the Invention

The invention relates to airspace supervision radar systems comprising a primary radar and a secondary radar; it relates more precisely to an electronic device for quantifying, at the output of the receiver of the secondary radar, pulse signals which form the responses transmitted by the aircraft under supervision.

2. Description of the Prior Art

In an airspace supervision radar system, the secondary radar, on the one hand, interrogates the aircraft in flight equipped with a cooperative responder and, on the other hand, picks up in return the responses transmitted by these aircraft. The bases of secondary radar and the international Conventions relating thereto are given, more especially, in the work by M. I. SKOLNIK "Radar Handbook", Chapter 38, (McGRAW-HILL 1971).

The response signal, or more briefly the response generated by the secondary radar responders, is a train of identical pulse comprising a number N of pulses which form a digital code; these code pulses are bracketed by two framing pulses which allow the response to be recognized and the beginning and the end of the code word to be identified. The responses transmitted by the different aircraft are specific to each plane and provide complementary and/or redundant information to that given by the echoes of the primary radar. These responses are picked up, on the ground, by the antenna of the secondary radar, then amplified and demodulated by the receiver. Prior to the operations for using these responses, the output pulse signals of the receiver must be reshaped, that is separated from the parasite signals then level-quantified.

The operation for quantifying the output signals of the receiver raises several difficulties, resulting more particularly from: the asynchronous responses from responders interrogated by adjacent secondary radars; the broad amplitude dynamics of the responses related to the gain parameters of the air-ground connection; at least partial superimposition of the responses coming from aircraft grouped together; parasite electromagnetic interferences and the noise of the receiver itself.

The problem which is raised is to construct a quantification device in which the quantification threshold is controlled by the instantaneous amplitude of the signals and in which the position of the sides of the output signals is, in the presence of multiple signals, scarcely erroneous. More briefly, the function of the quantification device is to restore as accurately as possible the shape of the pulses of each of the responses transmitted by the aircraft interrogated.

Quantification devices have already been constructed, they comprise essentially: a level comparator comprising a first input, or signal input, connected to the video frequency output of the receiver and a second input, or reference input, connected to a fixed or variable DC voltage source and generally controlled by the level of the thermal noise of the receiver. These quantification devices of the prior art present several disadvantages: the duration of the quantified signals depends on the absolute amplitude of the input signals, the result is that the position of the sides of the pulses is erroneous. Satisfactory adjustment of the reference level can never be achieved because too high a level leads to a loss of sensitivity at the range limit and conversely, too low a level introduces a widening of the pulses of the responses in the case of a high-amplitude response.

SUMMARY OF THE INVENTION

To remedy the above-mentioned disadvantages, the invention provides a self-matching quantification device, in this sense that the quantification level of the pulse signals is continually defined with respect to the instantaneous amplitude of the signals. The quantification device of the invention includes a level comparator with two output states with the inputs of this comparator being connected to two signal-formation channels whose common input is connected to the source of the input signals. The first signal-formation channel has a delay circuit having substantially equidistant taps, which are connected to the inputs of a linear operator of the "OR" type and the second signal-shaping channel comprising essentially a delay circuit whose delay time is less than that of the delay circuit disposed in the first channel. The ratio of the gains of the first and second signal-formation channels is adjusted to a predetermined value and a threshold voltage superimposed on one of these channels defines the sensitivity threshold of the device.

BRIEF DESCRIPTION OF THE DRAWINGS

Other characteristics and advantages provided by the invention will appeaar in the detailed description of one embodiment of a quantification device, made with reference to the accompanying drawings; in the drawings:

FIG. 1 shows the shape of the pulses transmitted by the responders cooperating with the secondary radars, FIG. 2 shows one embodiment of a quantification device in accordance with the invention, FIGS. 3a, 3b and 3c show the shape of the principal signals associated with the quantification device shown in FIG. 2, and FIG. 4 shows another embodiment of the quantification device of FIG. 2.

DESCRIPTION OF THE PREFERRED EMBODIMENTS

The response transmitted by the responders cooperating with the secondary radars is a train of pulses defined by fifteen time slots whose nominal duration has been fixed at 1.45 microseconds; within these time slots are positioned fourteen pulses, all identical in duration and amplitude, the nominal duration of these pulses being fixed at 0.45 microseconds, the central time slot being normally always unoccupied. The rank of these pulses is internationally identified by the indexed capital letters $F_1$, $C_1$ ... $D_4$ and $F_2$; the pulses $F_1$ and $F_2$ positioned respectively in the first and fifteenth time slots provide bracketing of the twelve code pulses $C_1$ to $D_4$. From the combination of the presence or absence of code pulses, 4096 different responses may be formed. If required, a sixteenth time slot, spaced by 4.35 microseconds from pulse $F_2$ is assigned to the transmission of a particular pulse, the "SPI" pulse.

FIG. 1 shows the trapezoidal shape of the pulses forming the response transmitted by the responder. The nominal duration ($t_d$) of these pulses, defined at 50% of the horizontal portion, is 0.45 microseconds; the maximum rise ($t_r$) and descent ($t_f$) tinmes of the sides of these pulses, defined between levels 10 and 90%, are respectively 0.1 and 0.2 microseconds. With no distortion in the transmission chain and no parasite signals, the response signals may be easily recognized, then decoded.

The shape of the responses supplied by the receiver of the secondary radar is appreciably different from those transmitted by the responder, on the one hand, because of the presence of the multiple interference signals already mentioned in the preamble of the description and, on the other hand, because of the amplification characteristics of the reception chains, and more especially, because of the bandwidth of the amplification circuits, the width of the pulses is slightly increased and the nonlinear characteristics of the different circuits introduce deformations of the sides of the pulses.

FIG. 2 shows, in the form of a block diagram, one embodiment of the device quantifying pulse signals in accordance with the invention. The input signal ($S_i$) is formed from video frequency pulses superimposed on noise signals and interference signals. This quantification device comprises the following elements:

a first and a second signal-formation channel having a common input connected to the input signal ($S_i$) and outputs connected respectively to the inputs of a level comparator (1) having two output states ($S_o$), a first low-level state and a second high-level state.

The first signal-formation channel comprises a first delay circuit (2) having a plurality of substantially equidistant taps ($2a$ to $2n$), these taps being connected respectively to a linear operator (3) of "OR" type, the output of this operator comprising a gain adjustment (4) and being connected to a first input of a summing circuit (5) whose second input is connected to a fixed or variable DC voltage source ($V_c$), the output of this summing circuit being connected to a first input of the level comparator (1).

The second signal-formation channel comprises essentially a second delay circuit (6) connected to a second input of the level comparator (1).

The level comparator (1) is a high-gain differential amplifier whose response speed is compatible with the bandwidth of the pulse signals; it may advantageously be constructed in accordance with integrated technology. The first and second delay circuits (2 and 6) are analog delay lines whose bandwidth is equal to or greater than the bandwidth of the input signal ($S_i$). The delay time of the first delay circuit (2) is proportional to the rise and descent time of the input pulses, the delay time of the second delay circuit (6) is proportional to the rise time of the input pulses. The number of taps in the first delay circuit is proportional to the effective bandwidth of the input signal ($S_i$). The type "OR" linear operator may be formed by the association of unidirectional active components such as diodes.

The function of the first signal-formation channel is to generate a plurality of replicas of the input signal progressively staggered in time and to provide an output signal whose instantaneous value represents the maximum amplitude of the replicas simultaneously present at the taps of the second delay circuit.

The function of the second signal-formation channel is to provide a replica of the input signal shifted by a time proportional to the rise time of the input pulses and depending on the quantification level chosen, this quantification level being defined as a fraction of the maximum level, or plateau level, of the input pulses.

The operation of the quantification device will now be described with reference to FIGS. 3a, 3b and 3c which show the shape of the signals at the inputs and the output of the level comparator.

FIG. 3a relates to the case of an isolated pulse superimposed on a low thermal noise level; the signal ($S_R$) constitutes a reference signal of the amplitude of the input pulse ($S_i$) and its duration is greater than that of the corresponding input pulse by an amount equal to the delay time of the second delay circuit, this signal ($S_R$) is superimposed on the voltage ($V_c$) which determines the sensitivity threshold of the device; the signal ($S_d$) is a replica of the input signal ($S_i$) shifted in time by an amount determined by the delay of the second delay circuit (6). The quantification level of the device is fixed with respect to the amplitudes of the plateau of signal ($S_R$) and of signal ($S_d$), this quantification level may be modified by adjusting the potentiometric element (4) disposed in the first signal-formation channel.

FIGS. 3b and 3c relate to the cases of pulses with unequal amplitudes which overlap in time. In these figures, it can be seen that the quantification level ($S_R$) is adjusted to the level and in advance of signal ($S_d$), which allows pulses which overlap at input to be separated, as shown by the output signal ($S_o$).

FIG. 4 shows, in the form of a block diagram, another embodiment of the quantification device described with reference to FIG. 2. According to this variation, the two signal-formation channels are combined at the level of the first delay circuit (2); to this end, a first delay circuit is provided with an additional tap ($2_p$) corresponding to the time delay of the second delay circuit and this additional tap is connected directly to the second input of the level comparator (1). It is also possible, so as to limit the number of taps, to use the intermediate tap whose delay time is substantially equal to that of the additional tap. When the rise and descent times of the pulse signals are substantially equal, the additional tap is placed in the middle of the delay circuit.

The device for quantifying pulse signals, described in FIGS. 2 and 4, may be disposed at the video frequency output of the receiver of a secondary radar installed on the ground, this video output comprising a means for restoring the DC component of the output signals. At the output of this quantification device there may be disposed a pulse-width discriminator which will eliminate the pulses of the quantified signal ($S_o$) whose duration is less than about 0.3 microseconds. The voltage source ($V_c$) may be slaved to the level of the thermal noise of the receiver and/or to the radar distance of the responses. The delay time of the first delay circuit (2) may be of the order of 0.2 to 0.3 microseconds, and the number of taps ($2a$ to $2n$) including the input and output taps may be between 6 and 8. The delay time of the second delay circuit (6) may be substantially equal to half the delay time of the first delay circuit. As shown in FIG. 4, the first delay circuit may be combined with the second delay circuit.

This quantification device forms a self-matching system, the quantification level being constantly controlled by the instantaneous amplitude of the pulse signals delivered by the receiver; this characteristic provides several advantages: the detection sensitivity of the secondary radar is increased with, as a consequence, a higher number of responses per antenna beam width, in comparison with the quantification devices of the prior art, the error in the position of the sides of the pulses is reduced and the superimposed responses with different levels may be separated within certain limits.

Because of its analog nature, the quantification device lends itself particularly well to constructions using analog components, however the delay circuits, in particular, may be constructed in accordance with digital techniques using preferably charge-transfer shift registers incremented by a clock signal whose frequency is of the order of magnitude of the bandwidth of the input signal ($S_i$).

The embodiments of the quantification device of the invention have been described by way of illustration, but are in no way limiting, and more particularly the means for adjusting the gains of the first and second signal-formation channels may be incorporated in one or other of these channels and the voltage source ($V_c$) may be superimposed on one of these two channels while taking the precaution of reversing the polarity of this source. Additionally, it is clear that a STC (Sensitive Time Constant) circuit may be inserted between the ground transmitter interrogative pulse generator and the scanning circuit to provide a DC voltage source which is sensitive to the radar distance of the response signal.

The signal quantification device finds its application in digital data transmission systems and, more especially, in the chain for transmitting response signals from responders picked up by secondary radars installed on the ground.

What is claimed is:

1. A pulse signal quantification device for quantifying the radar signals produced by a cooperative responder equipped aircraft comprising:
   a level comparator having at least two inputs and having two output states;
   a first formation channel connected to a first input of said level comparator, said first formation channel including a first delay circuit having a plurality of substantially equidistance taps connected respectively to the inputs of a linear operator of the OR type;
   a second formation channel connected to a second input of said level comparator having a second delay circuit whose time delay is less than that of the first delay circuit; wherein the ratio of the gains and the DC level difference of the first and second formation channels are predetermined.

2. The device as claimed in claim 1, wherein the DC level difference between the first and second signal-formation channels is supplied by a summing circuit disposed between the output of said "OR" operator and said comparator, with one input of said summing circuit being connected to a DC voltage source.

3. The device as claimed in claim 2, wherein said DC voltage source has a predetermined fixed value.

4. The device as claimed in claim 2, wherein said DC voltage source is variable as a function of time.

5. The device as claimed in claim 1, wherein the delay circuit of said second signal-formation channel is formed by a fraction of the delay circuit of said first formation channel.

6. The device as claimed in claim 1, wherein said first and second delay circuits are shift registers of the charge-transfer type, incremented by a clock signal whose frequency is of the order of magnitude of the bandwidth of the input signals.

7. The device as claimed in claim 6, wherein said first delay circuit is merged with a fraction of the second delay circuit.

* * * * *